United States Patent
Ro et al.

(10) Patent No.: US 9,634,658 B2
(45) Date of Patent: Apr. 25, 2017

(54) APPARATUS AND METHOD FOR A SELF-BIASING CIRCUIT FOR A FET PASSIVE MIXER

(71) Applicant: Futurewei Technologies, Inc., Plano, TX (US)

(72) Inventors: Yoonhyuk Ro, Gainesville, FL (US); Xuya Qiu, High Point, NC (US)

(73) Assignee: FUTUREWEI TECHNOLOGIES, INC., Plano, TX (US)

(*) Notice: Subject to any disclaimer, the term of this patent is extended or adjusted under 35 U.S.C. 154(b) by 56 days.

(21) Appl. No.: 14/689,793

(22) Filed: Apr. 17, 2015

(65) Prior Publication Data

US 2016/0308521 A1    Oct. 20, 2016

(51) Int. Cl.
*G05F 3/20* (2006.01)
*H03K 17/14* (2006.01)
*H04B 7/00* (2006.01)

(52) U.S. Cl.
CPC ............ *H03K 17/145* (2013.01); *H04B 7/00* (2013.01)

(58) Field of Classification Search
USPC .......................................... 327/537
See application file for complete search history.

(56) References Cited

U.S. PATENT DOCUMENTS

| 5,008,609 | A  | * | 4/1991 | Fukiage | G11C 5/147 323/313 |
| 8,670,739 | B1 | * | 3/2014 | Murphy  | H04B 1/1027 375/350 |
| 2014/0103991 | A1 | * | 4/2014 | Iyengar | G05F 3/02 327/537 |
| 2014/0111252 | A1 | * | 4/2014 | Zhuo    | H03F 1/301 327/109 |

* cited by examiner

*Primary Examiner* — Lincoln Donovan
*Assistant Examiner* — Patrick Chen
(74) *Attorney, Agent, or Firm* — Slater Matsil, LLP

(57) ABSTRACT

Embodiments are provided for biasing circuits with compensation of process variation without band-gap referenced current or voltage. In an embodiment, a circuit for biasing a field-effect transistor (FET) passive mixer comprises a series of diode-connected FETs, and a series of first resistors connected to a voltage source and the series of diode-connected FETs. Additionally, one or more second resistors are connected to the series of diode-connected FETs and to ground. In an embodiment method, the total number of the diode-connected FETs and the total number of the resistors, including the first and second series of resistors, are selected. The total number of the second resistors is then determined according to a defined relation between the selected total number of diode-connected FETs and the total number of resistors.

19 Claims, 3 Drawing Sheets

APPARATUS AND METHOD FOR A SELF-BIASING CIRCUIT FOR A FET PASSIVE MIXER

TECHNICAL FIELD

The present invention relates to radio frequency (RF) circuit design, and, in particular embodiments, to an apparatus and method for a self-biasing circuit for a field-effect transistor (FET) passive mixer with compensation of process variation without a band-gap Reference.

BACKGROUND

FET mixers have advantages over other forms of mixers and are used in a number of different RF applications. Depending on their type and the RF application, FET mixers can provide gain and improved noise performance. FET mixers can be broadly categorized into two types: passive mixers and active mixers. When used in the passive mode, a FET mixer effectively acts a switch. In this role, the drain-source resistance behaves as a voltage variable resistor. The resistance of the channel is set by the gate-source voltage. When used as a switch, the FET is biased with the drain and source at zero volts (V) DC. The gate is then biased between zero V and the pinch-off level. Setting the gate at a mid-point allows the local oscillator to act as a switching signal, switching the FET mixer element on and off. The bias voltage is varied to compensate for gate-source voltage variation in the FET mixer due to process and temperature changes. In general, the bias voltage is controlled with a biasing circuit using a band-gap referenced constant current. However, there is a need for an improved and efficient biasing circuit for the FET mixer without a band-gap referenced current since the band-gap referenced current requires band-gap generation and current mirrors which add more complexity, more current consumption, and more die areas.

SUMMARY OF THE INVENTION

In accordance with an embodiment, a circuit for biasing an n-channel field-effect transistor (NFET) passive mixer comprises a series of diode-connected NFETs, and a series of first resistors connected to a voltage source and the series of diode-connected NFETs. Additionally, one or more second resistors are connected to the series of diode-connected NFETs and to ground.

In accordance with another embodiment, a circuit for biasing a p-channel field-effect transistor (PFET) passive mixer comprises a series of diode-connected PFETs, and a series of first resistors connected to a voltage source and the series of diode-connected PFETs. Additionally, one or more second resistors connected to the series of diode-connected PFETs and to ground.

In accordance with yet another embodiment, a method for forming a circuit for biasing a field-effect transistor (FET) passive mixer comprises selecting a total number of diode-connected FETs in series, in the circuit, and selecting a total number of resistors including a first series of resistors between a voltage source of the circuit (Vdd) and the diode-connected FETs and a second series of resistors between the diode-connected FETs and ground. A total number of resistors is in the second series is determined according to a defined relation between the total number of diode-connected FETs and the total number of resistors.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
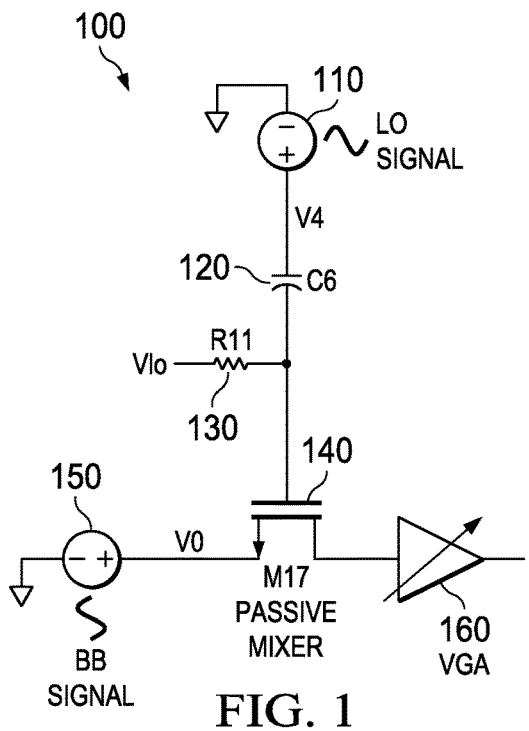
FIG. 1 is a diagram of a n-channel FET (NFET) passive mixer with bias voltage, input signal sources, and variable gain amplifier (VGA)

FIG. 1 a circuit 100 comprising an n-channel (also referred to as negative-channel) FET (NFET) passive mixer 140 with bias voltage (Vlo), base-band (BB) input signal source 150, LO signal source 110, and variable gain amplifier (VGA) 160. The gate of the NFET passive mixer 140 is connected to a local oscillator (LO) signal source 110 (providing high frequency voltage swing), through a capacitor 120. The source of the NFET passive mixer 140 is connected to a base-band (BB) signal source 150. The drain of the NFET passive mixer 140 is connected to a variable gain amplifier (VGA) 160. In parallel to the LO signal source 110 and the capacitor 120, a resistor 130 is also connected to the gate of the NFET passive mixer 140. A common-mode voltage of local oscillator (Vlo) is applied to the gate of NFET passive mixer 140 through the resistor 130. Therefore, the NFET passive mixer 140 is biased up by Vlo at the gate and serves as a passive mixer that mixes the LO signal and the BB signal and passes the mixed signal to the VGA 160. The Vlo is adjusted properly to track the variation in the gate-to-source voltage (Vgs) of the NFET passive mixer 140. The Vgs variation can be due to process changes and/or temperature changes. The Vlo is adjusted to account for the Vgs changes and keep the gate voltage of the passive mixer 140 at optimum common-mode voltage.

Figure 2:
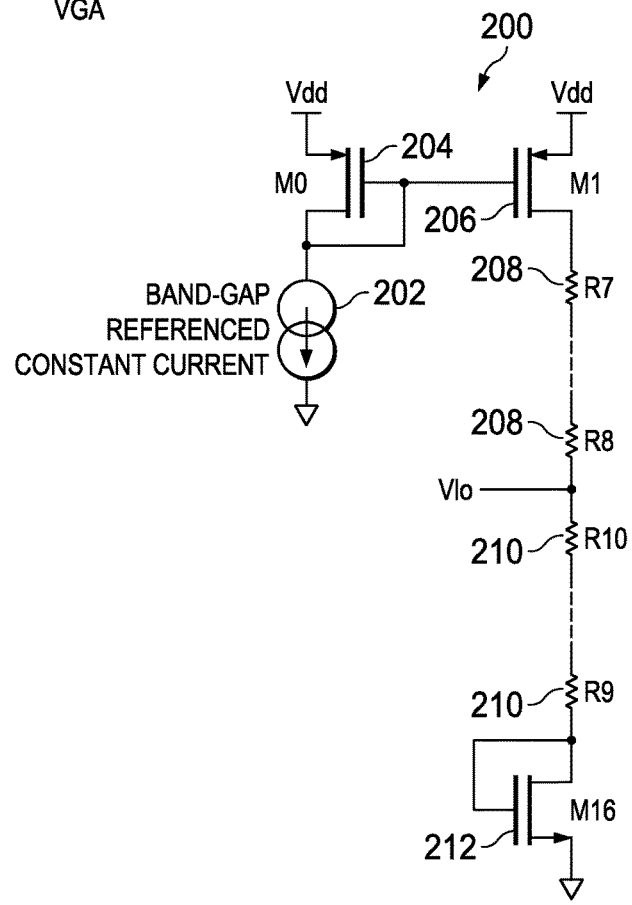
FIG. 2 is a diagram of biasing circuit using band-gap referenced constant current, for a NFET passive mixer.

FIG. 2 shows a typical way to implement biasing circuit 200 for the NFET passive mixer 140. The biasing circuit 200 uses a band-gap referenced constant current source 202 to control Vlo for the NFET passive mixer 140. The biasing circuit 200 comprises a p-channel (or positive-channel) FET (PFET) 204 with a source connected to a positive voltage (Vdd), a drain connected to the band-gap referenced constant current source 202, and a gate connected to the gate of a second PFET 206. The two connected PFETs 204 and 206 are said to form a PFET mirror. The gate is also connected to the drain of the PFET 204 making a diode-connected PFET. The source of the second PFET 206 is also connected to Vdd. The drain of the second PFET 206 is connected to a series of resistors 208 and a second series of resistors 210. In turn, the series of resistors 210 are connected to the drain of a NFET 212. The gate is also connected to the drain of the NFET 212 making it a diode-connected NFET. The band-gap referenced constant current source 202 and the source of the NFET 212 are grounded. The voltage Vlo between the series of resistors 208 and the second series of resistors 210 is connected to the resistor 130 of the circuit 100 of FIG. 1. In FIG. 2, the series of resistors 208 and second series of resistors 210 is referred to as a resistor array.

The biasing circuit 200 compensates for process variation in the NFET passive mixer 140 with the diode-connected NFET 212 and the resistor array, which are biased by constant current generated from the band-gap referenced constant current source 202. The current of the source 202 is constant with process and temperature variations. The diode-connected NFET 212 imitates the Vgs variation of the NFET passive mixer 140 over process variation, assuming that the voltage across the resistor 130 remains approximately constant. One possible drawback of this implementation is that the PFET mirror (PFETs 204 and 206) may cause a different process variation factor in the bias voltage Vlo compared to the NFET.

Figure 3:
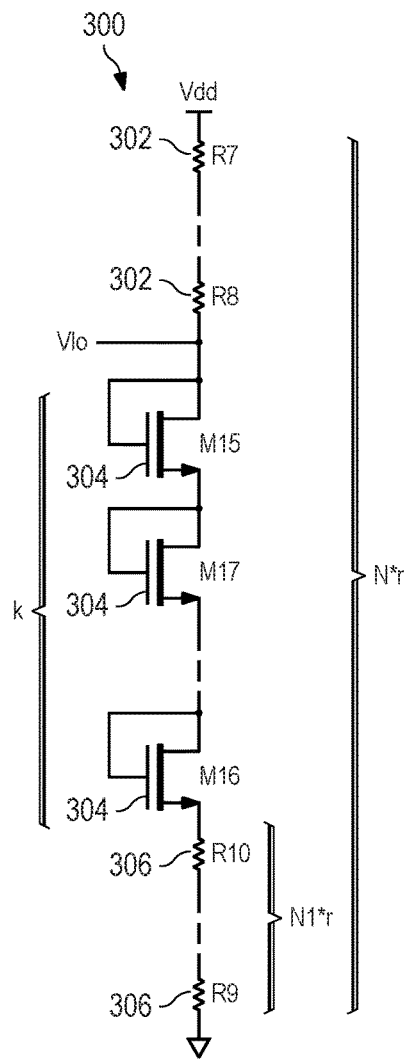
FIG. 3 is a diagram of an embodiment of a self-biasing circuit without a band-gap reference, for a NFET passive mixer.

Embodiments are provided herein for biasing circuits with compensation of process variation without band-gap referenced current or voltage. FIG. 3 shows an embodiment of a biasing circuit 300 without a band-gap reference. This is referred to herein as a self-biasing circuit where no band-gap referenced current or voltage source is used to compensate for process variation in the passive mixer. The self-biasing circuit 300 provides the Vlo for a NFET passive mixer such as the NFET passive mixer 140. The biasing circuit 300 comprises series of diode-connected NFETs 304 (having their gates connected to their respective drains) connected to a positive voltage (Vdd) through a series of resistors 302. The NFETs 304 are connected to ground (GND) through a second series of resistors 306. The voltage Vlo across the diode-connected NFETs 304 and the second series of resistors 306 is applied as Vlo to the gate of the passive mixer 140.

An integer number (k) of diode-connected NFETs 304 with the resistor array can be determined to satisfy the condition that bias voltage Vlo change over process variation $$\left(\frac{\partial Vlo}{\partial P}\right)$$

follows the Vgs change in the NFET passive mixer 140 over process variation $$\left(\frac{\partial Vgs}{\partial P}\right),$$

where P is the process function. As shown in the equations, this condition is satisfied when $N_1$ equals to $$\left(\frac{k-1}{k}\right)*N,$$

where N is the total number of resistors 302 and 306 (or total resistance value) from Vdd to GND, and $N_1$ is the total number of resistors 306 (or resistance value) from Vlo to GND. The preferable number, k, of diode-connected NFETs 304 is at least two or more since the necessary condition with one diode-connected NFET 304 would be $N_1 \approx 0$, which means that Vlo should be close to one Vgs from GND. Biasing the NFET passive mixer 140 at one Vgs from GND is not practical. However, using two or three diode-connected NFETS 304 provides the necessary condition for Vlo being at $$N_1 = \left(\frac{1}{2}\right)*N$$

or $$N_1 = \left(\frac{2}{3}\right)*N,$$

which is around the middle or higher than the middle of the resistor array. $N_1$ may be one resistor or more. More diode-connected NFETs 304 may be recommended if higher bias voltage is necessary for some applications. The number of diode-connected NFETs 304 can be chosen depending on the magnitude of bias voltage needed. The relationship between N and $N_1$ to satisfy the condition of matching $$\left(\frac{\partial Vlo}{\partial P}\right)$$

to $$\left(\frac{\partial Vgs}{\partial P}\right)$$

can be derived mathematically as shown in Table 1.

TABLE 1

$$Vlo = k*Vgs + \frac{(Vdd - kVgs)}{NR}N_1R$$

$$= k*Vgs + \frac{(Vdd - kVgs)}{N}N_1$$

$$= \left(k - \frac{kN_1}{N}\right)*Vgs + \left(\frac{N_1}{N}\right)*Vdd$$

TABLE 1-continued $$\frac{\partial Vlo}{\partial P} = \left(k - \frac{kN_1}{N}\right) * \frac{\partial Vgs}{\partial P}$$

$$N_1 = \left(\frac{k-1}{k}\right) * N \text{ to satisfy } \frac{\partial Vlo}{\partial P} = \frac{\partial Vgs}{\partial P}$$

Figure 4:
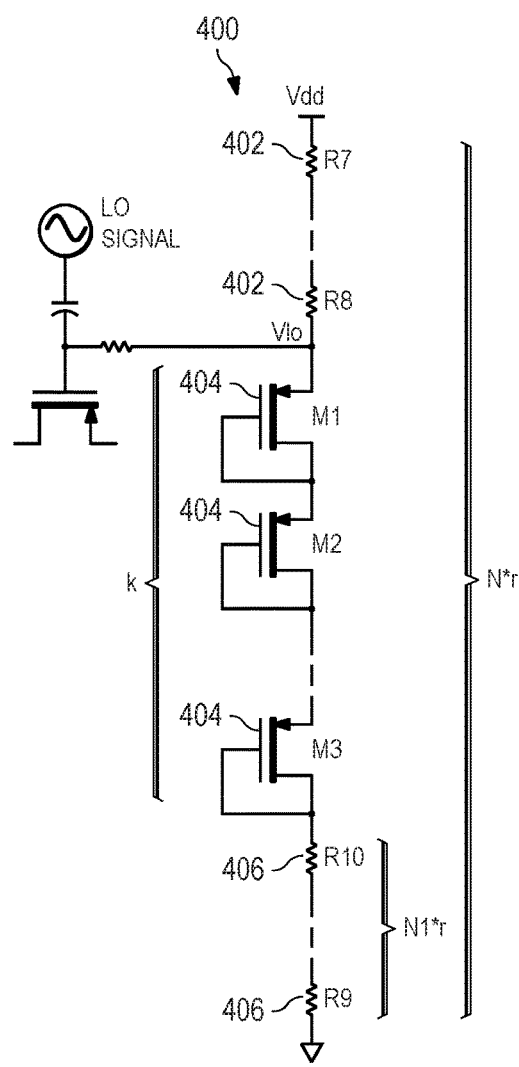
FIG. 4 is a diagram of an embodiment of a self-biasing circuit without a band-gap reference, for a p-channel FET (PFET) passive mixer.

This approach of selecting a suitable number of resistors above and below a series of diode-connected FETs, with respect to GND can also be applied with a series of PFETs with a resistive array for biasing a PFET passive mixer. FIG. 4 shows an embodiment of a self-biasing circuit 400 that provides the Vlo for a PFET passive mixer. The PFET passive mixer includes a PFET in an arrangement similar to the NFET in the NFET passive mixer 140. The biasing circuit 400 comprises a series of diode-connected PFETs 404 (having their gates connected to their respective drains) connected to a positive voltage (Vdd) through a series of resistors 402. The PFETs 404 are connected to GND through a second series of resistors 406. The voltage Vlo across the diode-connected PFETs 404 and the second series of resistors 406 is applied as Vlo to the gate of the PFET passive mixer.

An integer number (k) of diode-connected PFETs 404 with the resistor array can be determined to satisfy the condition that $$\left(\frac{\partial Vlo}{\partial P}\right)$$

follows $$\left(\frac{\partial Vsg}{\partial P}\right)$$

where P is the process function. Following the same logic described above, the condition is satisfied when $N_1$ equals to $$\left(\frac{k-1}{k}\right) * N,$$

where N is the total number of resistors 402 and 406 (or total resistance value) from Vdd to GND, and $N_1$ is the total number of resistors 406 (or resistance value) from Vlo to GND. The relationship between N and $N_1$ to satisfy the condition of matching $$\left(\frac{\partial Vlo}{\partial P}\right)$$

to $$\left(\frac{\partial Vsg}{\partial P}\right)$$

can be derive mathematically as shown in Table 2. The derivation is similar to that shown in Table 1 since the structures are similar.

TABLE 2

$$Vlo = k * Vsg + \frac{(Vdd - kVsg)}{NR} N_1 R$$

TABLE 2-continued $$= k * Vsg + \frac{(Vdd - kVsg)}{N} N_1$$

$$= \left(k - \frac{kN_1}{N}\right) * Vsg + \left(\frac{N_1}{N}\right) * Vdd$$

$$\frac{\partial Vlo}{\partial P} = \left(k - \frac{kN_1}{N}\right) * \frac{\partial Vsg}{\partial P}$$

$$N_1 = \left(\frac{k-1}{k}\right) * N \text{ to satisfy } \frac{\partial Vlo}{\partial P} = \frac{\partial Vsg}{\partial P}$$

Figure 5:
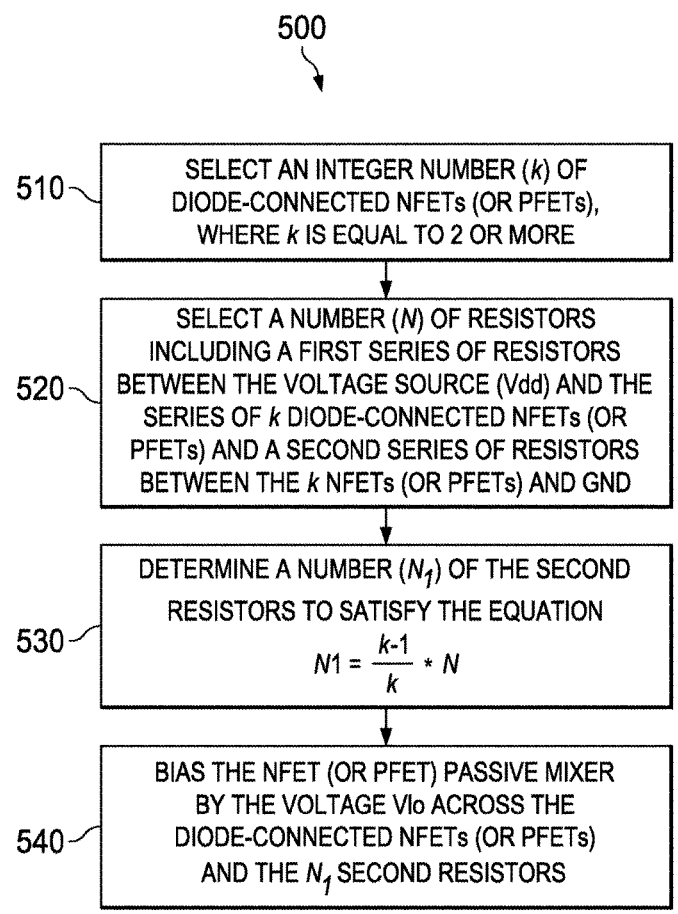
FIG. 5 is a flowchart of an embodiment method for forming a self-biasing circuit without a band-gap reference, for a NFET or PFET passive mixer.

FIG. 5 shows an embodiment method 500 for forming a biasing circuit without a band-gap reference, for a NFET or PFET passive mixer. At step 510, an integer number (k) of diode-connected NFETs (or PFETs) is selected. The number k is equal to 2 or more. The number k can be higher as higher bias voltage is needed for some applications. At step 520, a number (N) of resistors including a first series of resistors between the voltage source (Vdd) and the series of k diode-connected NFETs (or PFETs) and a second series of resistors between the k NFETs (or PFETs) and GND is selected. At step 530, a number ($N_1$) of the second resistors is determined or calculated to satisfy the equation $$N1 = \left(\frac{k-1}{k}\right) * N,$$

which satisfies the condition $$\left(\frac{\partial Vlo}{\partial P}\right) = \left(\frac{\partial Vgs}{\partial P}\right)$$

described above. At step 540, the NFET (or PFET) passive mixer is biased by the voltage Vlo across the diode-connected NFETs (or PFETs) and the $N_1$ second resistors.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A circuit for biasing an n-channel field-effect transistor (NFET) passive mixer, the circuit comprising:
a first biasing circuit comprising:
a biasing circuit output voltage coupled to the NFET passive mixer:
a series of diode-connected NFETs;
a series of first resistors connected to a voltage source and the series of diode-connected NFETs; and
one or more second resistors connected to the series of diode-connected NFETs and to ground,
wherein a total number of the one or more second resistors, a total number of resistors including the first resistors and the one or more second resistors, and a total number of diode-connected NFETs satisfy matching variation in the biasing circuit output voltage with variation in gate-to-source voltage of the NFET passive mixer.

2. The circuit of claim 1, wherein the series of diode-connected NFETs comprises a number of NFETs in accordance with a pre-determined amount of biasing for the passive mixer.

3. The circuit of claim 1, wherein each diode-connected NFET comprises a gate connected to a drain of the diode-connected NFET.

4. The circuit of claim 1, wherein the total number of one or more second resistors is equal to a product of a ratio of $(k-1)/k$ and a total number of resistors including the first resistors and the one or more second resistors, and wherein k is a total number of the diode-connected NFETs.

5. The circuit of claim 4, wherein the biasing circuit output voltage is a voltage across the series of diode-connected NFETs and the one or more second resistors that varies with gate-to-source voltage of the NFET passive mixer due to process or temperature changes.

6. The circuit of claim 1, wherein the biasing circuit output voltage is a voltage at a drain of one of the diode-connected NFETs that is connected to the series of first resistors of the first biasing circuit and that is connected to the NFET passive mixer through a third resistor, and wherein the biasing circuit output voltage is a common-mode voltage of local oscillator for a gate of the NFET passive mixer.

7. A circuit for biasing a p-channel field-effect transistor (PFET) passive mixer, the circuit comprising:
a first biasing circuit comprising:
a biasing circuit output voltage coupled to the PFET passive mixer:
a series of diode-connected PFETs;
a series of first resistors connected to a voltage source and the series of diode-connected PFETs; and
one or more second resistors connected to the series of diode-connected PFETs and to ground,
wherein a total number of the one or more second resistors, a total number of resistors including the first resistors and the one or more second resistors, and a total number of diode-connected PFETs satisfy matching variation in the biasing circuit output voltage with variation in gate-to-source voltage of the NFET passive mixer.

8. The circuit of claim 7, wherein the series of diode-connected PFETs comprises a number of PFETs in accordance with a pre-determined amount of biasing for the passive mixer.

9. The circuit of claim 7, wherein each diode-connected PFET comprises a gate connected to a drain of the diode-connected PFET.

10. The circuit of claim 7, wherein the total number of one or more second resistors is equal to a product of a ratio of $(k-1)/k$ and a total number of resistors including the first resistors and the one or more second resistors, and wherein k is a total number of the diode-connected PFETs.

11. The circuit of claim 10, wherein the biasing circuit output voltage is a voltage across the series of diode-connected PFETs and the one or more second resistors that varies with the.

12. The circuit of claim 7, wherein the biasing circuit output voltage is a voltage at a drain of one of the diode-connected PFETs that is connected to the series of first resistors of the first biasing circuit and that is connected to the PFET passive mixer through a third resistor, and wherein the biasing circuit output voltage is a common-mode voltage of local oscillator for the gate of the PFET passive mixer.

13. A method for forming a circuit for biasing a field-effect transistor (FET) passive mixer, the method comprising:
selecting a total number of diode-connected FETs in series, in the circuit;
selecting a total number of resistors including a first series of resistors between a voltage source of the circuit (Vdd) and the diode-connected FETs and a second series of resistors between the diode-connected FETs and ground; and
determining a total number of resistors in the second series according to a defined relation between the total number of diode-connected FETs and the total number of resistors,
wherein the defined relation matches variation in a biasing output voltage and variation in gate-to-source voltage of the FET passive mixer.

14. The method of claim 13 further comprising biasing the FET passive mixer by the biasing output voltage.

15. The method of claim 14, wherein the biasing output voltage is applied to a gate of the FET passive mixer through a third resistor.

16. The method of claim 13, wherein the resistors in the second series include at least one resistor.

17. The method of claim 13, wherein determining a total number of resistors in the second series according to the defined relation includes matching the total number of resistors in the second series to a product of a ratio of $(k-1)/k$ and the total number of resistors, and wherein k is the total number of diode-connected FETs.

18. The method of claim 13, wherein the biasing output voltage is a voltage across the diode-connected FETs and the second series of resistors that varies with the gate-to-source voltage of the FET passive mixer due to process or temperature changes.

19. The method of claim 13, wherein the total number of diode-connected FETs is selected in accordance with a pre-determined magnitude of bias voltage for a gate of the FET passive mixer.

* * * * *